United States Patent
Zaffetti et al.

(10) Patent No.: US 8,869,877 B2
(45) Date of Patent: Oct. 28, 2014

(54) MONOLITHIC COLD PLATE CONFIGURATION

(75) Inventors: Mark A. Zaffetti, Suffield, CT (US); Michael B. Laurin, South Hadley, MA (US)

(73) Assignee: Hamilton Sundstrand Space Systems International, Inc., Windsor Locks, CT (US)

( * ) Notice: Subject to any disclaimer, the term of this patent is extended or adjusted under 35 U.S.C. 154(b) by 278 days.

(21) Appl. No.: 12/901,602

(22) Filed: Oct. 11, 2010

(65) Prior Publication Data

US 2012/0085523 A1 Apr. 12, 2012

(51) Int. Cl.
- F28F 3/12 (2006.01)
- F28F 9/02 (2006.01)
- H01L 23/473 (2006.01)

(52) U.S. Cl.
CPC . *F28F 3/12* (2013.01); *F28F 9/026* (2013.01); *H01L 23/473* (2013.01)
USPC .......................................... 165/80.4; 165/168

(58) Field of Classification Search
USPC .......... 165/76, 80.4, 168; 361/699; 408/2, 13, 408/16, 705
See application file for complete search history.

(56) References Cited

U.S. PATENT DOCUMENTS

| | | | |
|---|---|---|---|
| 1,490,706 A | | 4/1924 | Madden |
| 1,884,612 A | * | 10/1932 | Dinzl .............................. 165/168 |
| 1,905,653 A | * | 4/1933 | Schranz ......................... 165/168 |
| 1,929,824 A | | 10/1933 | Polley |
| 2,329,049 A | * | 9/1943 | Hulme .......................... 266/207 |
| 2,572,972 A | * | 10/1951 | Baldwin ........................ 165/168 |
| 3,936,320 A | | 2/1976 | Goslee et al. |
| 3,985,273 A | | 10/1976 | Davis, Jr. |
| 4,004,642 A | | 1/1977 | Dardick |
| 4,079,410 A | * | 3/1978 | Schierz ......................... 257/714 |
| 4,092,083 A | | 5/1978 | Larry |
| 4,137,002 A | | 1/1979 | Barker et al. |
| 4,226,281 A | | 10/1980 | Chu |
| 4,437,802 A | | 3/1984 | Hall, Jr. |
| 4,715,964 A | | 12/1987 | Harms |
| 4,815,899 A | | 3/1989 | Regan |
| 4,884,630 A | * | 12/1989 | Nelson et al. .................. 165/170 |
| 4,896,410 A | | 1/1990 | Spitzmesser et al. |
| 4,939,624 A | | 7/1990 | August et al. |
| 5,043,797 A | | 8/1991 | Lopes |
| 5,097,385 A | | 3/1992 | Chao-Fan Chu et al. |
| 5,181,812 A | | 1/1993 | Labinka |
| 5,199,487 A | * | 4/1993 | DiFrancesco et al. ........ 165/168 |
| 5,217,332 A | | 6/1993 | Takasaki et al. |
| 5,443,585 A | | 8/1995 | Kawase et al. |
| 5,729,995 A | | 3/1998 | Tajima |
| 5,924,481 A | | 7/1999 | Tajima |
| 6,045,304 A | | 4/2000 | Yamamoto |
| 6,058,010 A | * | 5/2000 | Schmidt et al. ............... 361/689 |
| 6,089,314 A | * | 7/2000 | Becker et al. ................. 165/168 |
| 6,167,952 B1 | | 1/2001 | Downing |

(Continued)

OTHER PUBLICATIONS

Extended European Search Report dated Apr. 10, 2013 for Application No. EP 11 17 7328.

*Primary Examiner* — Allen Flanigan (74) *Attorney, Agent, or Firm* — Carlson, Gaskey & Olds, P.C.

(57) ABSTRACT

A cold plate assembly includes a monolithic cold plate which defines a trough located to intersect a fluid path.

23 Claims, 13 Drawing Sheets

(56) References Cited

U.S. PATENT DOCUMENTS

| | | |
|---|---|---|
| 6,230,791 B1 | 5/2001 | Van Dine et al. |
| 6,520,252 B1 | 2/2003 | Bizzarro |
| 6,521,516 B2 * | 2/2003 | Monzon et al. ............... 438/514 |
| 6,631,077 B2 * | 10/2003 | Zuo ............................ 361/699 |
| 6,840,140 B1 | 1/2005 | Wenacur |
| 7,004,691 B2 | 2/2006 | Nomura |
| 7,024,874 B2 | 4/2006 | Zywiak et al. |
| 7,059,390 B2 * | 6/2006 | Laurila et al. ............... 165/80.4 |
| 7,061,766 B2 | 6/2006 | Wainwright et al. |
| 7,077,189 B1 | 7/2006 | Reyzin et al. |
| 7,118,292 B2 | 10/2006 | Miao et al. |
| 7,135,863 B2 | 11/2006 | Arik et al. |
| 7,188,488 B2 | 3/2007 | Army, Jr. et al. |
| 7,207,751 B2 | 4/2007 | Feddersen |
| 7,320,359 B2 * | 1/2008 | Miettinen et al. ............... 165/70 |
| 7,353,864 B2 | 4/2008 | Zaffetti et al. |
| 7,393,162 B2 | 7/2008 | Hecht |
| 7,420,808 B2 | 9/2008 | Campbell et al. |
| 7,518,871 B2 | 4/2009 | Campbell et al. |
| 7,523,622 B2 | 4/2009 | Zywiak et al. |
| 7,604,040 B2 | 10/2009 | Ghosh et al. |
| 7,641,101 B2 | 1/2010 | Campbell et al. |
| 2005/0274505 A1 | 12/2005 | Laurila et al. |
| 2006/0262502 A1 * | 11/2006 | Chang et al. .................. 361/699 |
| 2007/0289718 A1 | 12/2007 | McCordic et al. |

* cited by examiner

MONOLITHIC COLD PLATE CONFIGURATION

STATEMENT REGARDING FEDERALLY SPONSORED RESEARCH OR DEVELOPMENT

This invention was made with government support with the National Aeronautics and Space Administration under Contract No.: NNJ06TA25C. The government therefore has certain rights in this invention.

BACKGROUND

The present disclosure relates to a heat transfer device, and more particularly to a cold plate assembly.

Operation of high speed electronic components such as microprocessors, graphics processors and other modules produces heat which may need to be removed for efficient operation. Heat removal provides, for example, lower operating temperatures, higher operating speeds, greater computing power and higher reliability.

Cold plates are liquid cooled structures with numerous closely spaced fluid passages which provide a heat transfer function for components mounted thereto. For relatively long cold plates, the fluid passages may be gun drilled from opposite ends.

Although effective, current inspection techniques which measure drill wander include ultrasonic and x-ray inspection which may be time consuming and somewhat subjective.

SUMMARY

A cold plate assembly according to an exemplary aspect of the present disclosure includes a monolithic cold plate which defines a trough located to intersect a fluid path.

A cold plate assembly according to an exemplary aspect of the present disclosure includes a monolithic cold plate which defines a trough located to intersect a fluid path that includes a multiple of parallel passages, each of the parallel passages defined by a first gun drilled passage and a second gun drilled passage which intersect the trough, the trough defines a generally toothed configuration with a multiple of open areas, each of the multiple of open areas corresponds with one of the multiple of parallel passages to separate the respective first gun drilled passage and the second gun drilled passage. A cap receivable within the trough, the cap defines a multiple of cap teeth which fit within the respective multiple of open areas, each of the multiple of cap teeth defines an orifice which provides fluid communication between the respective first gun drilled passage and the second gun drilled passage.

A method of manufacturing a cold plate according to an exemplary aspect of the present disclosure includes gun drilling a first passage from one side of a monolithic plate into a trough and gun drilling a second passage opposed to the first passage from an opposite side of the monolithic plate into the trough.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1A:
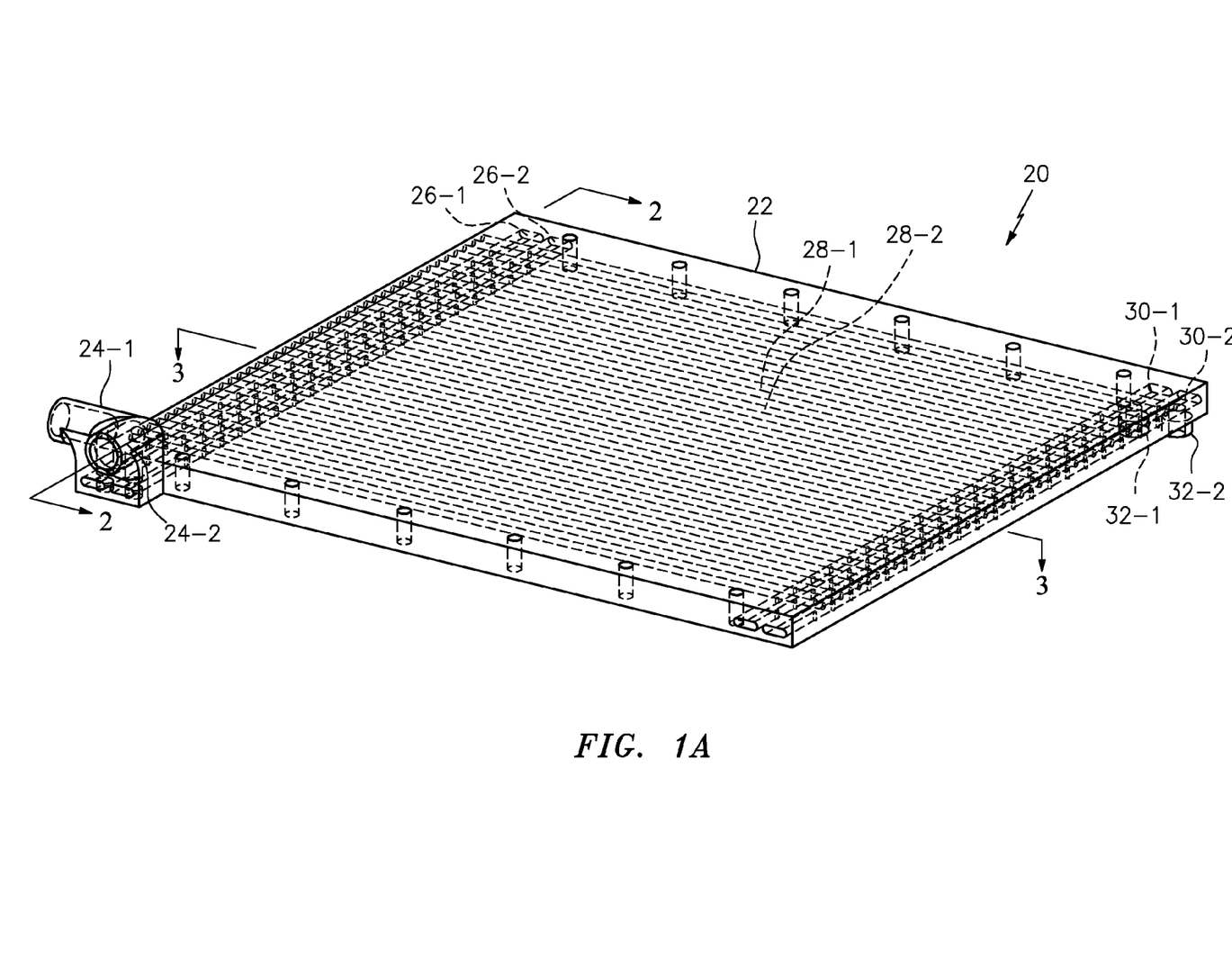
FIG. 1A is a general perspective phantom view of a cold plate assembly.

FIG. 1A schematically illustrates a cold plate assembly 20. The cold plate assembly 20 as disclosed herein is a redundant fluid monolithic cold plate assembly which provides structural rigidity and may be manufactured of, for example, an aluminum alloy. It should be understood that other structures with gun drilled passages may additionally benefit herefrom.

The cold plate assembly 20 generally includes a plate 22 with a first inlet port 24-1 and a second inlet port 24-2 that communicates fluid into a respective first inlet fluid manifold 26-1 and second inlet fluid manifold 26-2. Fluid is communicated through the respective inlet fluid manifolds 26-1, 26-2 then into a respective first fluid path 28-1 and second fluid path 28-2 which extend transverse to the inlet fluid manifolds 26-1, 26-2 and across the plate 22. From the first fluid path 28-1 and second fluid path 28-2, the fluid is collected in outlet fluid manifolds 30-1, 30-2 for communication out of the cold plate assembly 20 through a respect first outlet port 32-1 and second outlet port 32-2 to thereby provide fluid circulation therethrough.

The inlet fluid manifolds 26-1, 26-2, outlet fluid manifolds 30-1, 30-2 and the fluid paths 28-1, 28-2 are machined in the plate 22 then closed with various plugs (not specifically shown). The inlet fluid manifolds 26-1, 26-2 and outlet fluid manifolds 30-1, 30-2 are generally transverse to the first fluid path 28-1 and second fluid path 28-2 which extend therebetween. That is, the inlet fluid manifold 26-1 communicates with the outlet fluid manifold 30-1 through the first fluid path 28-1 and the inlet fluid manifold 26-2 communicates with the outlet fluid manifold 30-2 through the second fluid path 28-2.

Figure 1B:
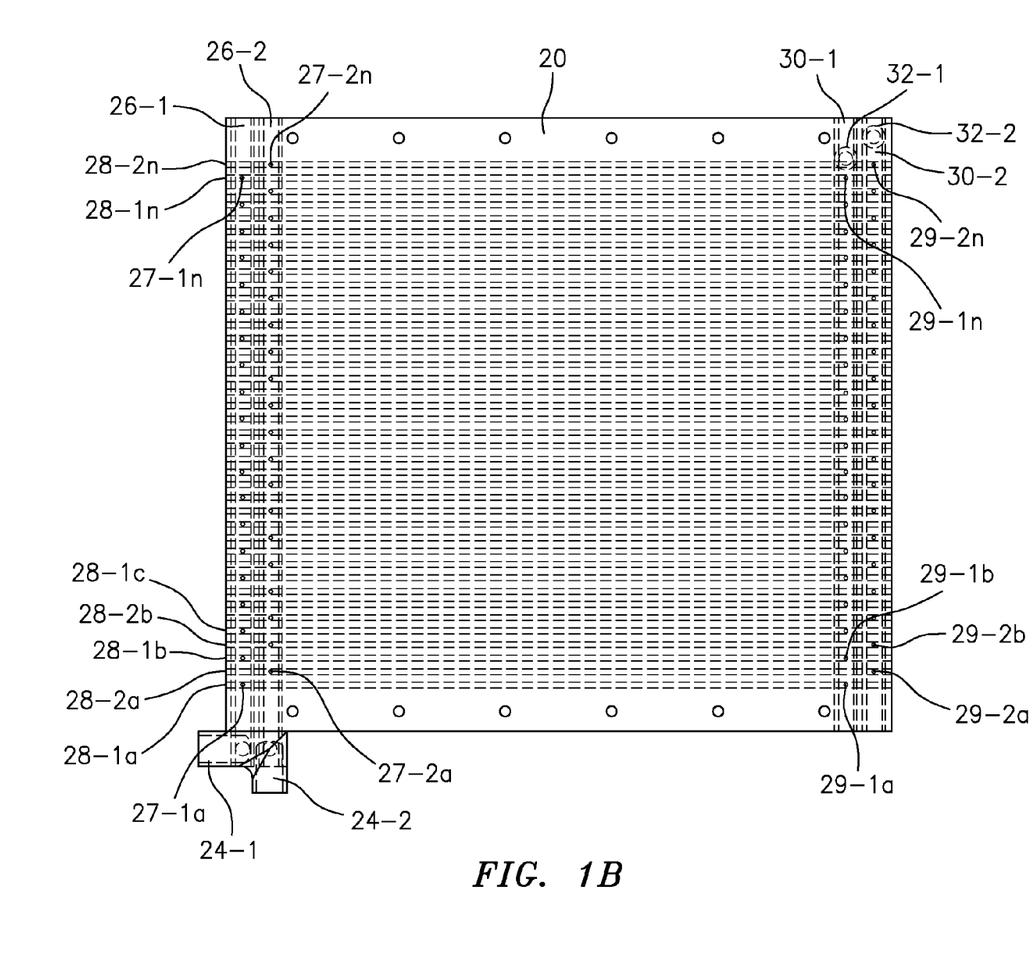
FIG. 1B is a general top phantom view of the cold plate assembly.

The first fluid path 28-1 and second fluid path 28-2 each respectively include numerous parallel oriented individual fluid passages 28-1a-n and 28-2a-n. The fluid passages 28-1a-n typically alternate with the second fluid passages 28-2*a-n* and communicate with their respective inlet fluid manifolds 26-1, 26-2 and outlet fluid manifolds 30-1, 30-2 through respective transverse passages 27-1*a-n*, 27-2*a-n* and 29-1*a-n*, 29-2*a-n* (FIG. 1B).

Figure 2:
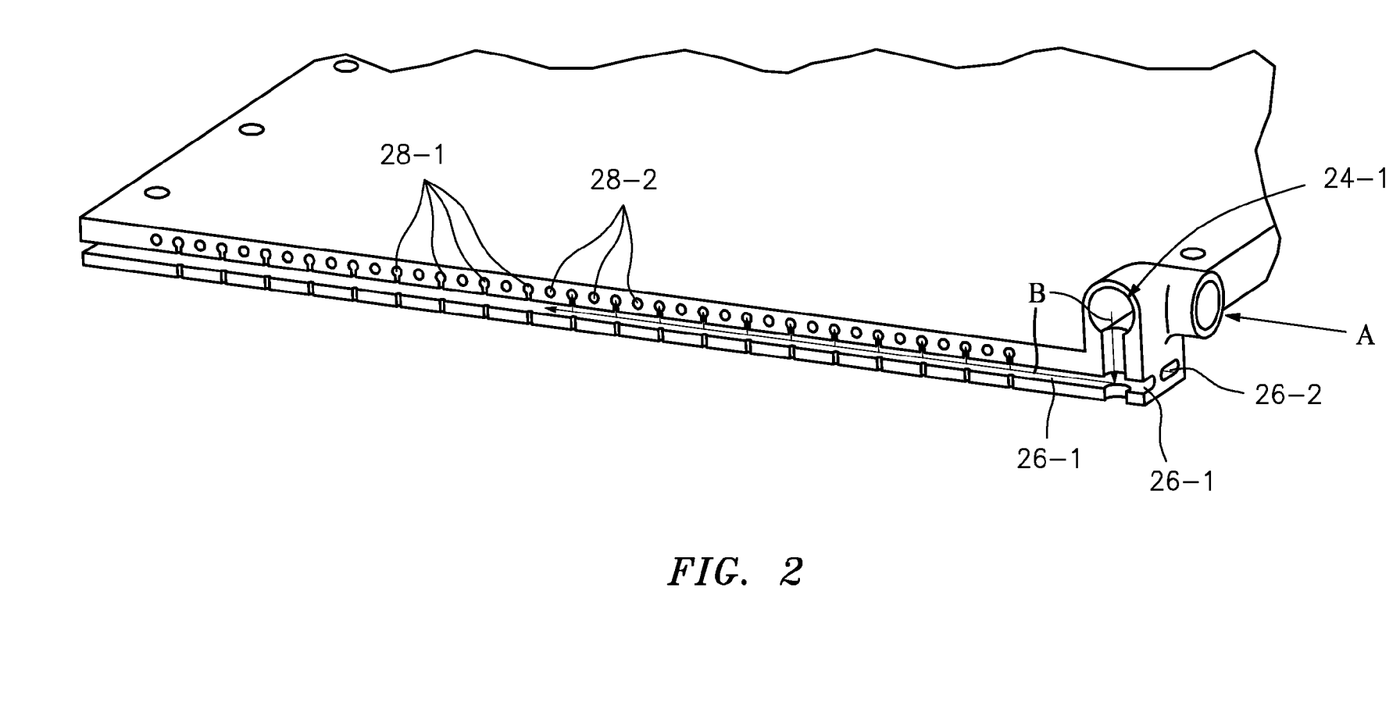
FIG. 2 is a sectional view along line 2-2 in FIG. 1A through a fluid manifold of the cold plate assembly.
Figure 3:
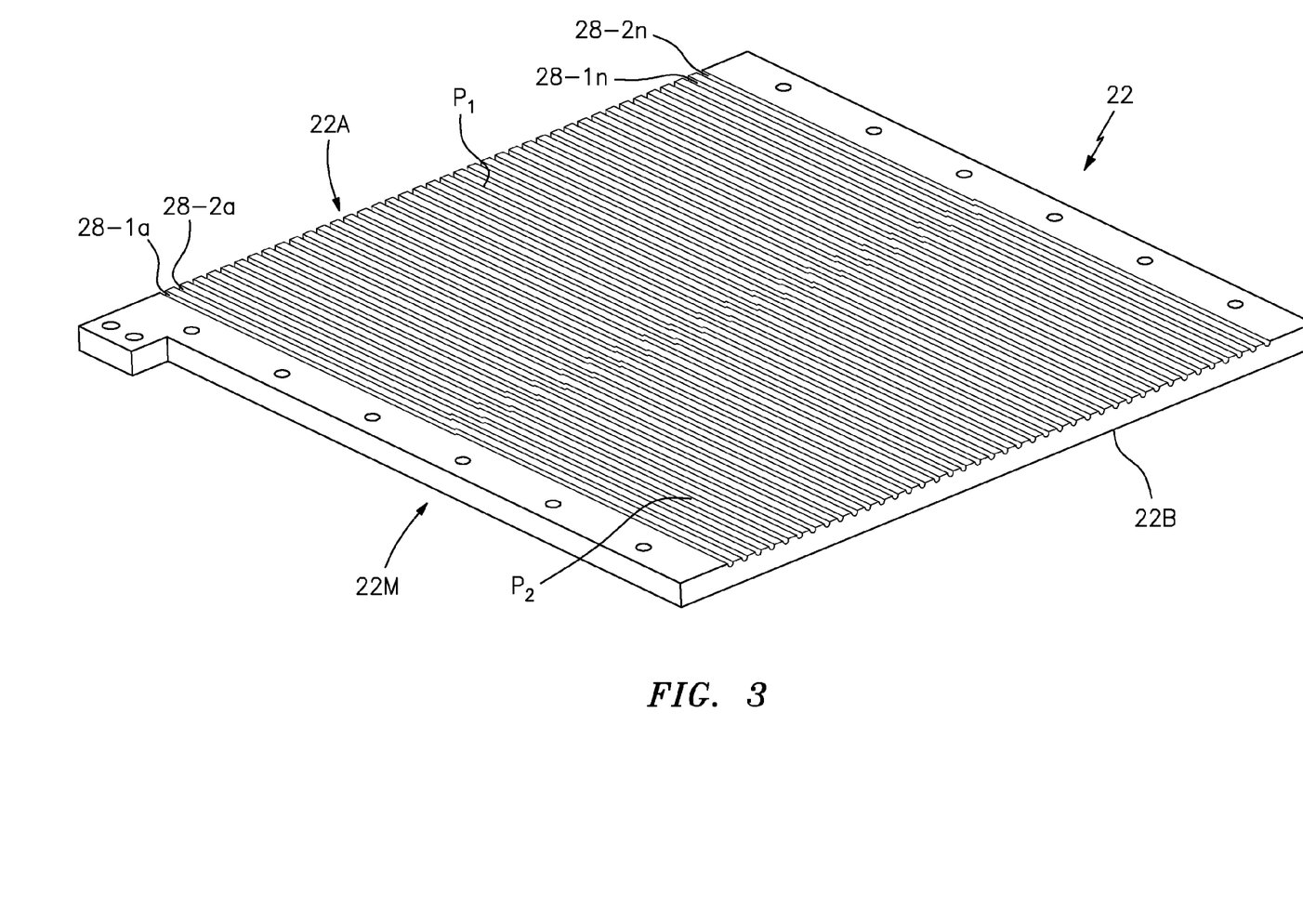
FIG. 3 is a sectional view along line 3-3 in FIG. 1A to illustrate a first and second fluid path, each with numerous parallel oriented individual fluid passages within the cold plate assembly.
Figure 4:
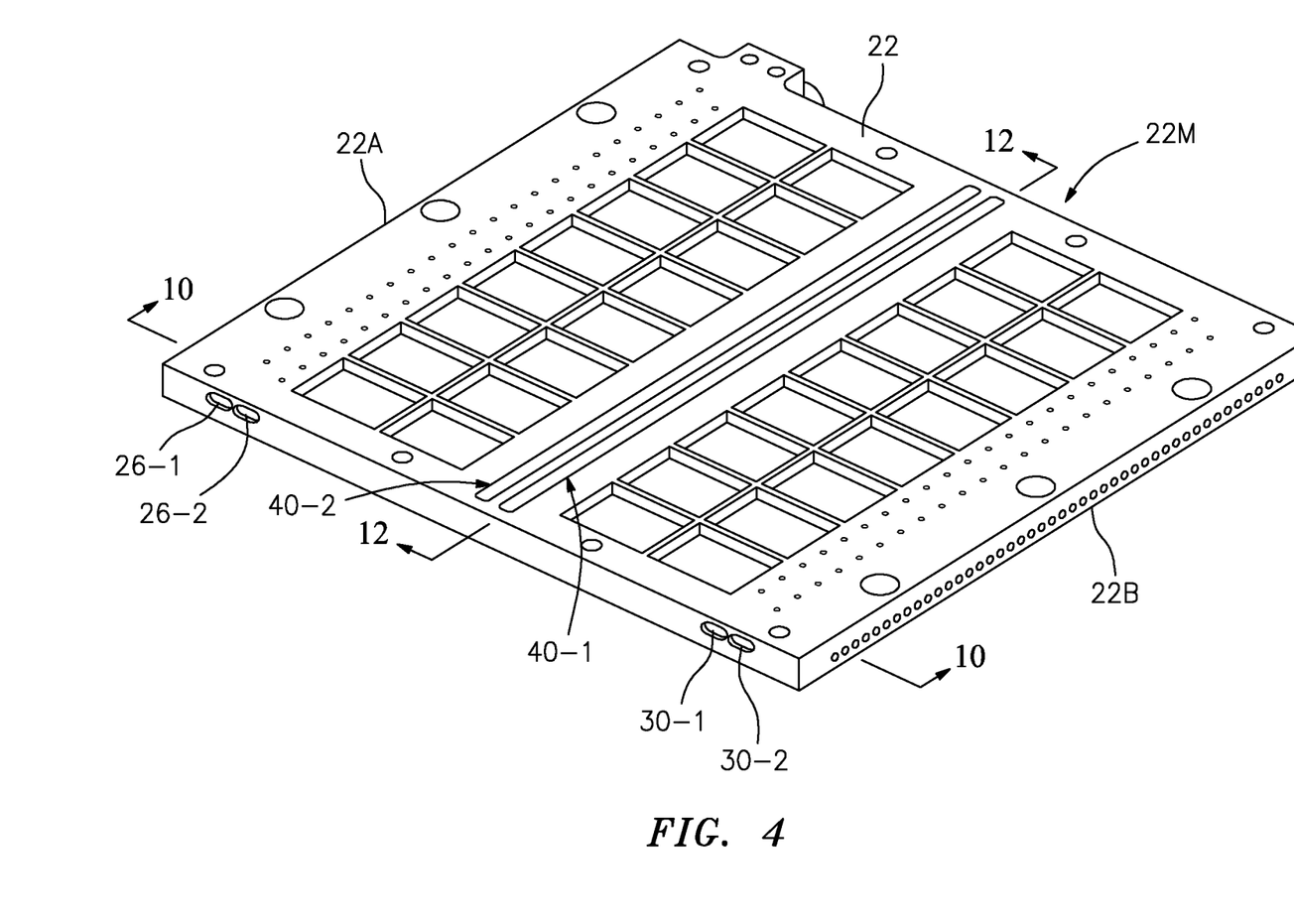
FIG. 4 is a general perspective bottom view of the cold plate assembly.

With Reference to FIG. 2, each passage 28-1*a-n* and 28-2*a-n* are individually gun drilled from opposite sides 22A, 22B of the plate 22 by gun drilled passages P1, P2 which meet generally at an intersection 22M of the plate 22 (FIGS. 3 and 4). It should be understood that the intersection 22M is generally located at the middle section of the plate 22 to minimize each gun drill passage P1, P2 length; however, other design considerations may result in locating the intersection 22M at other positions within the plate 22.

Figure 5:
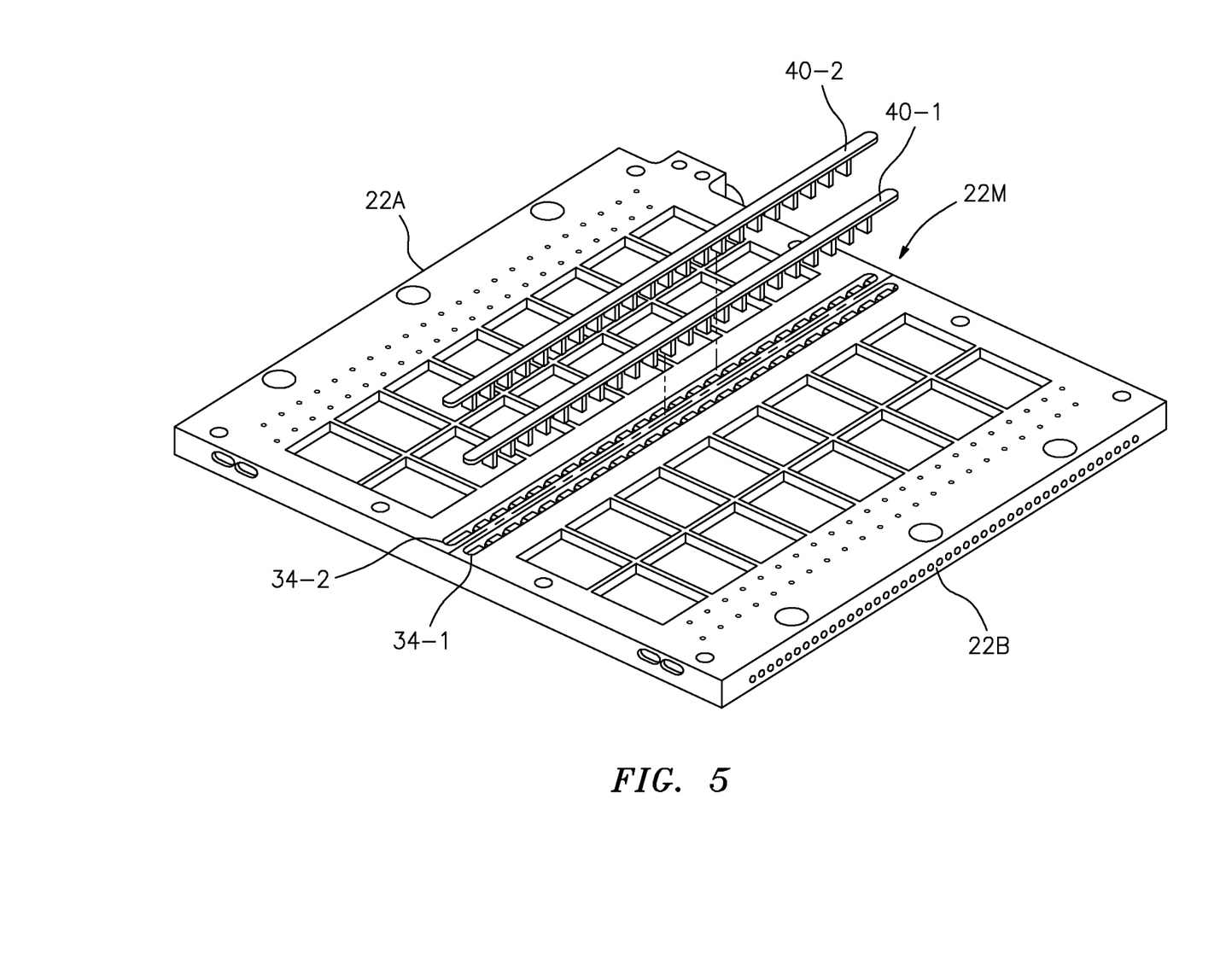
FIG. 5 is an exploded view of the cold plate assembly.

With Reference to FIG. 5, a trough 34-1, 34-2 is located at the intersection 22M. That is, trough 34-1 is located at the gun drill intersection which defines each passage 28-1*a-n* of the first fluid path 28-1 and trough 34-2 is located at the gun drill intersection which defines each passage 28-2*a-n* of the second fluid path 28-2.

Figure 6:
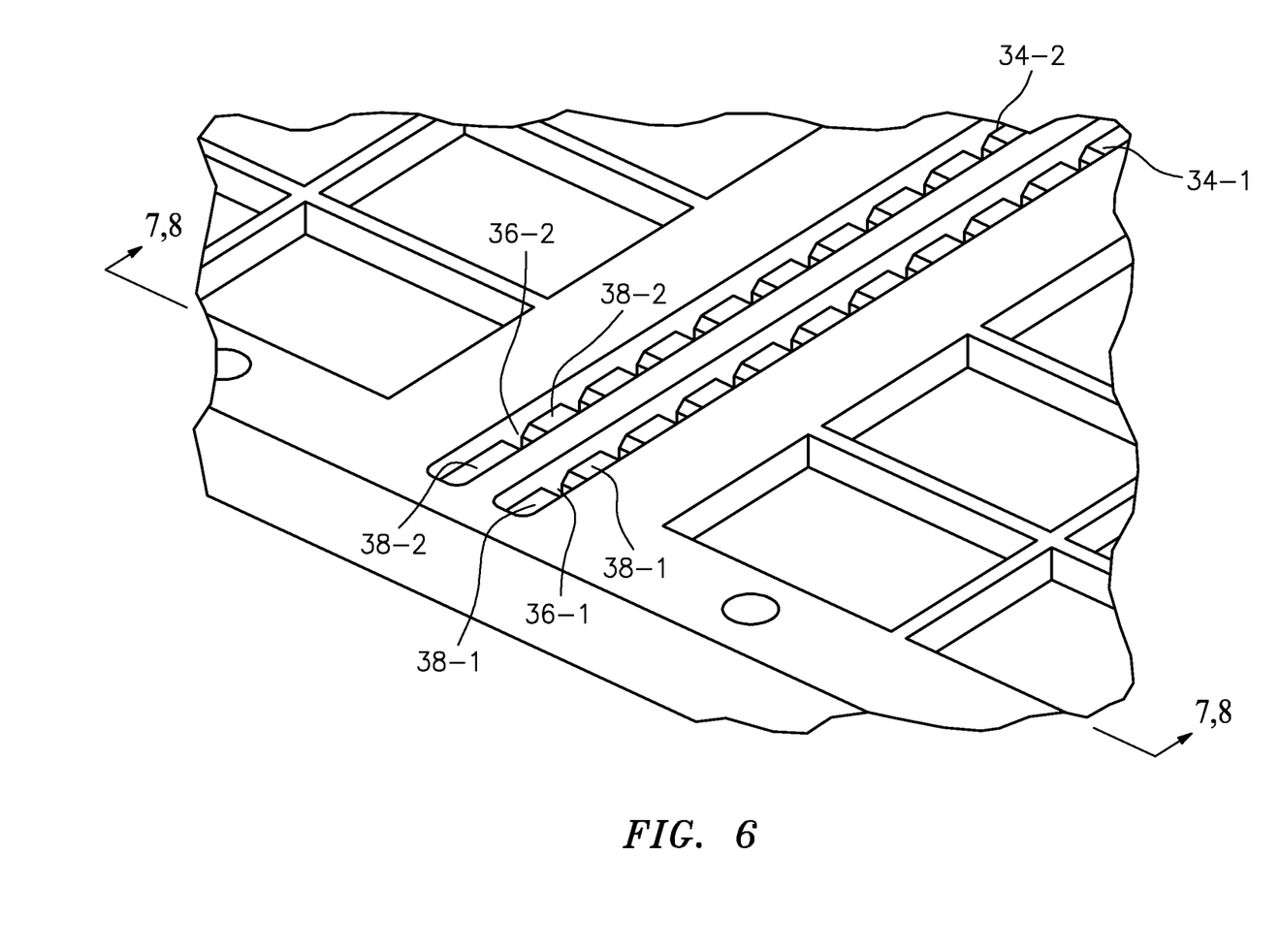
FIG. 6 is an expanded bottom view of the cold plate assembly illustrating a trough which intersects the fluid paths.
Figure 7:
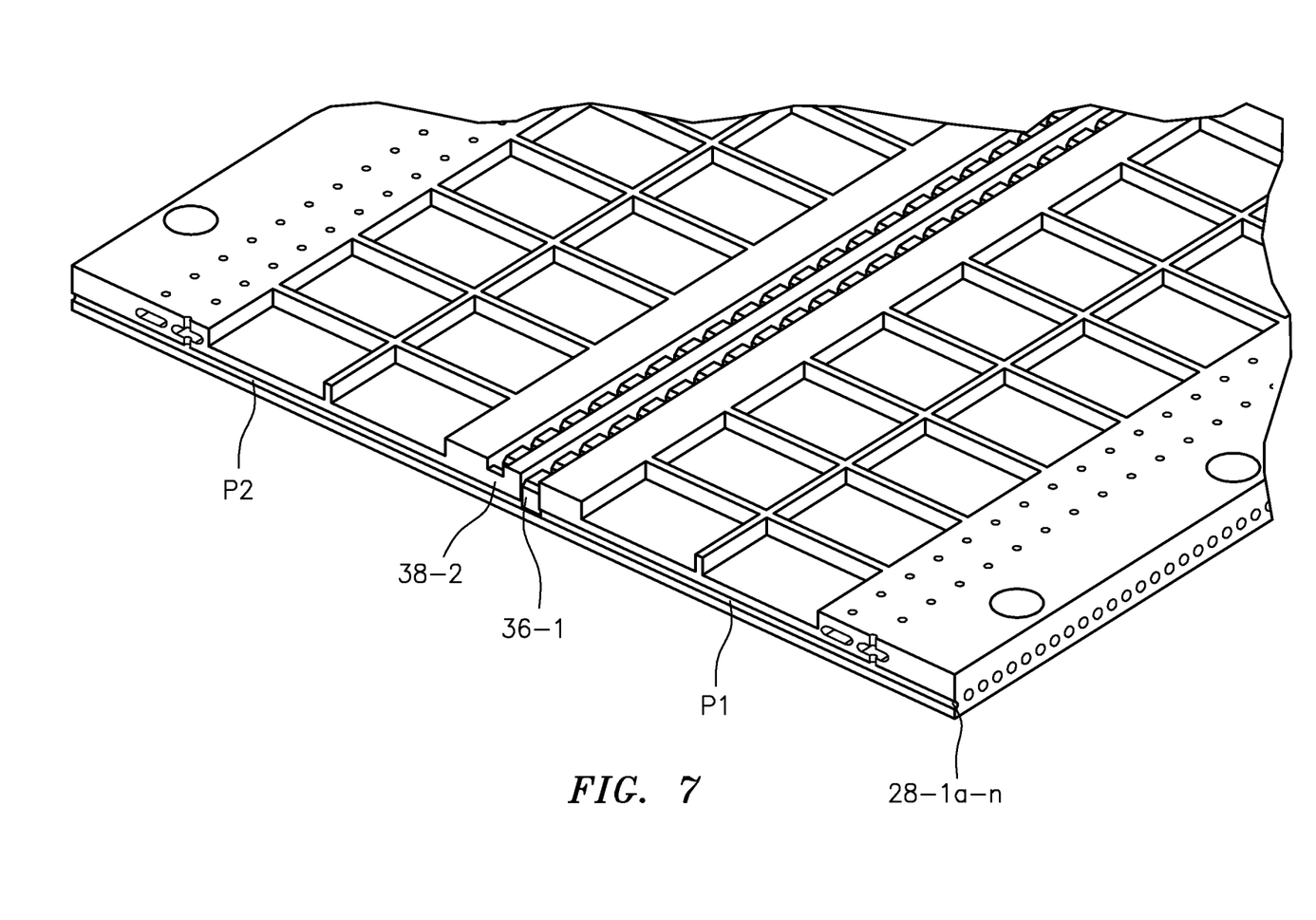
FIG. 7 is a sectional view along line 7-7 in FIG. 6 to illustrate the troughs.
Figure 8:
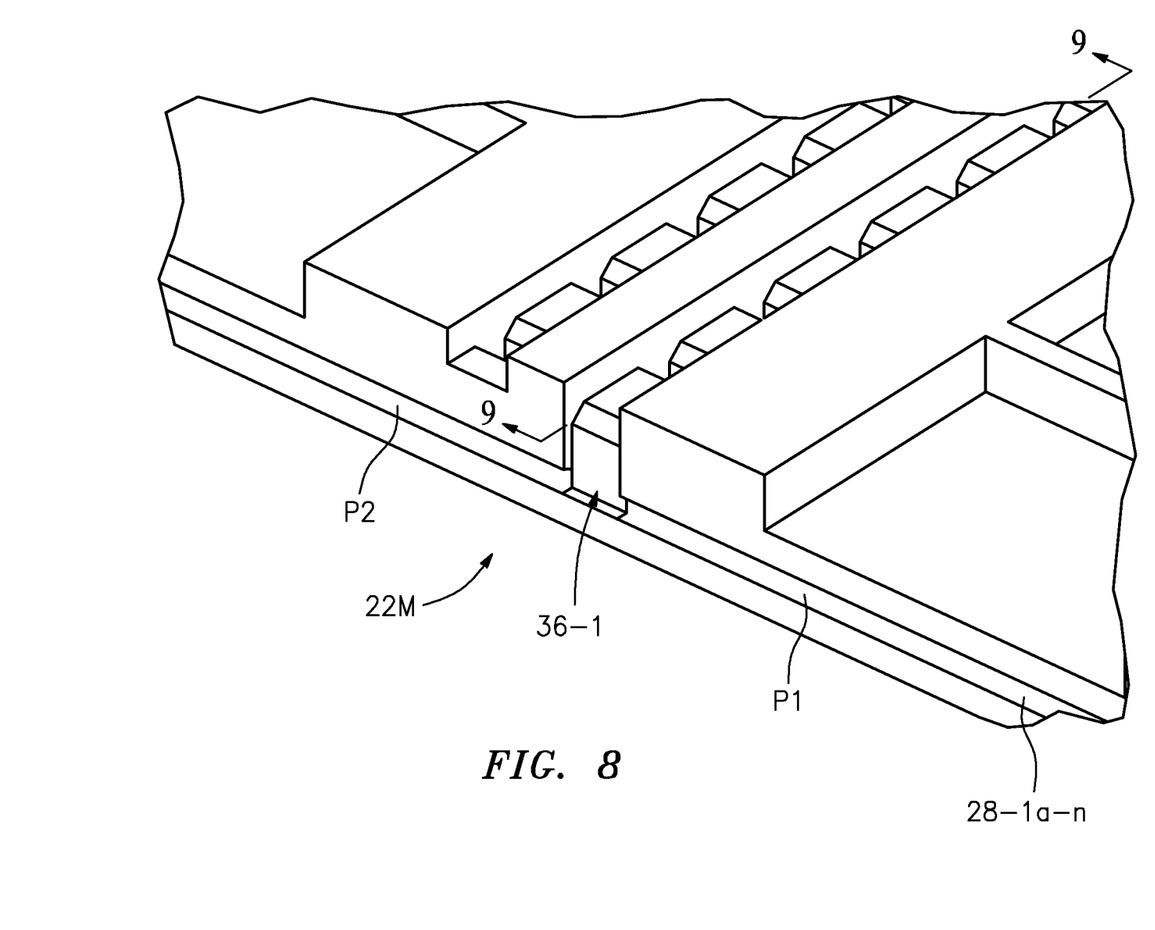
FIG. 8 is an expanded sectional view along line 8-8 in FIG. 6 to illustrate an open area formed by the trough which intersects an individual fluid passage.
Figure 9:
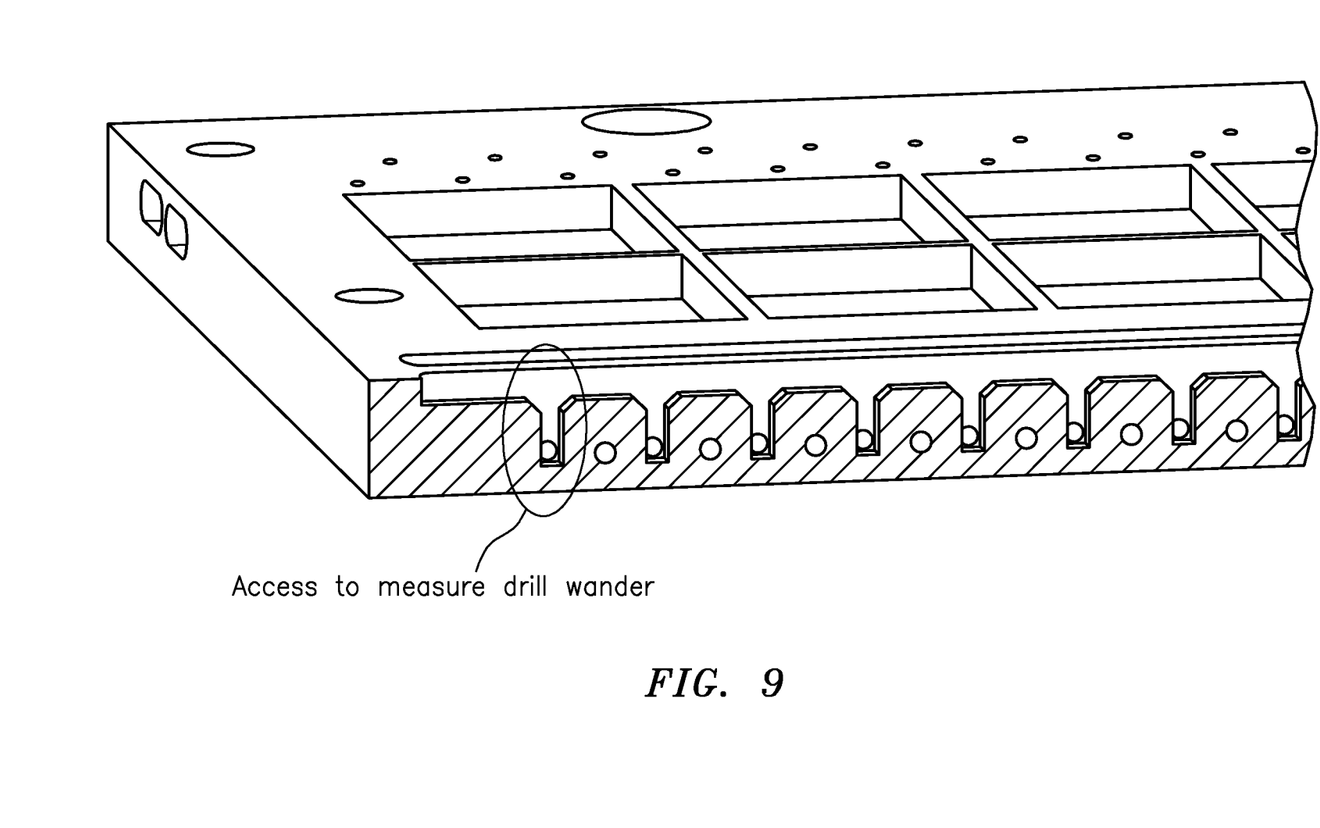
FIG. 9 is a sectional view along line 9-9 in FIG. 8 to illustrate the gun drilled passages which form the individual fluid passages.

Each trough 34-1, 34-2 is of a generally toothed configuration. The first trough 34-1 defines an open area 36-1 between each trough tooth 38-1 at the gun drill intersection of the gun drilled passages P1, P2 for each individual fluid passages 28-1*a-n* of the first fluid path 28-1 while the trough teeth 38-1 allow passage of the individual fluid passages 28-2*a-n* of the second fluid path 28-2 to the second trough 34-2 (FIG. 6). Likewise, the second trough 34-2 defines an open area 36-2 between each trough tooth 38-2 at the gun drill intersection of the gun drilled passages P1, P2 for each individual fluid passages 28-2*a-n* of the second fluid path 28-2 while the trough teeth 38-2 allow passage of the individual fluid passages 28-1*a-n* of the first fluid path 28-1 to the first trough 34-2 (FIG. 7). That is, the teeth 38-1, 38-2 are offset and in alignment with the opposite respective fluid passages 28-1*a-n* and 28-2*a-n*. The troughs 34-1, 34-2 thereby remove the location at which the two gun drilled passages P1, P2 intersect and thereby eliminate any potential mismatch (FIG. 8). Also, direct access is provided to each individual fluid passages 28-1*a-n* and 28-2*a-n* for direct inspection of any drill wander (FIG. 9).

A cap 40-1, 40-2 is respectively used to close the troughs 34-1, 34-2. The cap 40-1, 40-2 may be brazed or otherwise welded into position as typical with the multiple of plugs used to close other passages within the monolithic plate 22.

Figure 10:
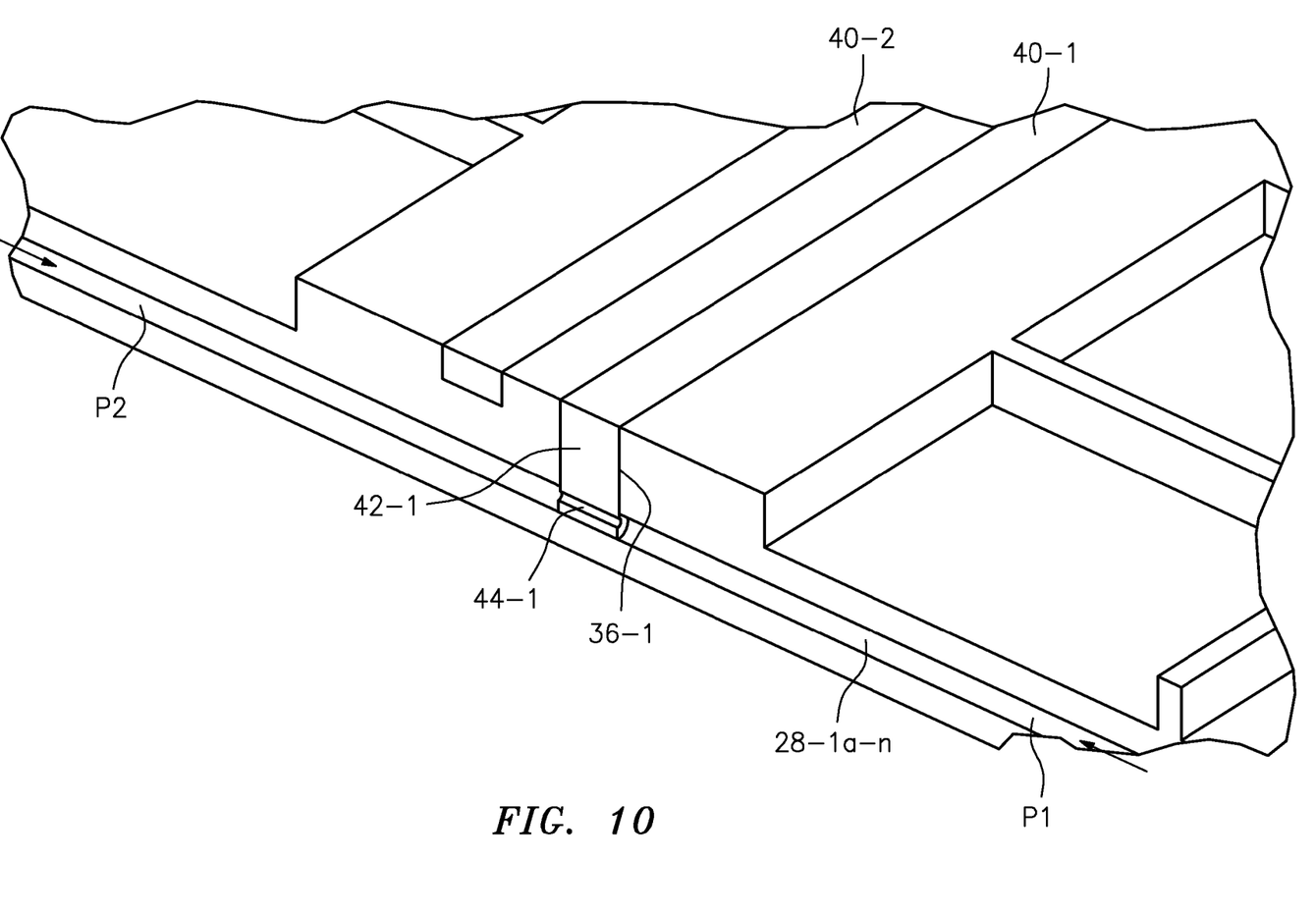
FIG. 10 is an expanded sectional view along line 10-10 in FIG. 4 to illustrate the open area formed by the trough which intersects an individual fluid passage and a cap tooth which defines an orifice therein.
Figure 11:
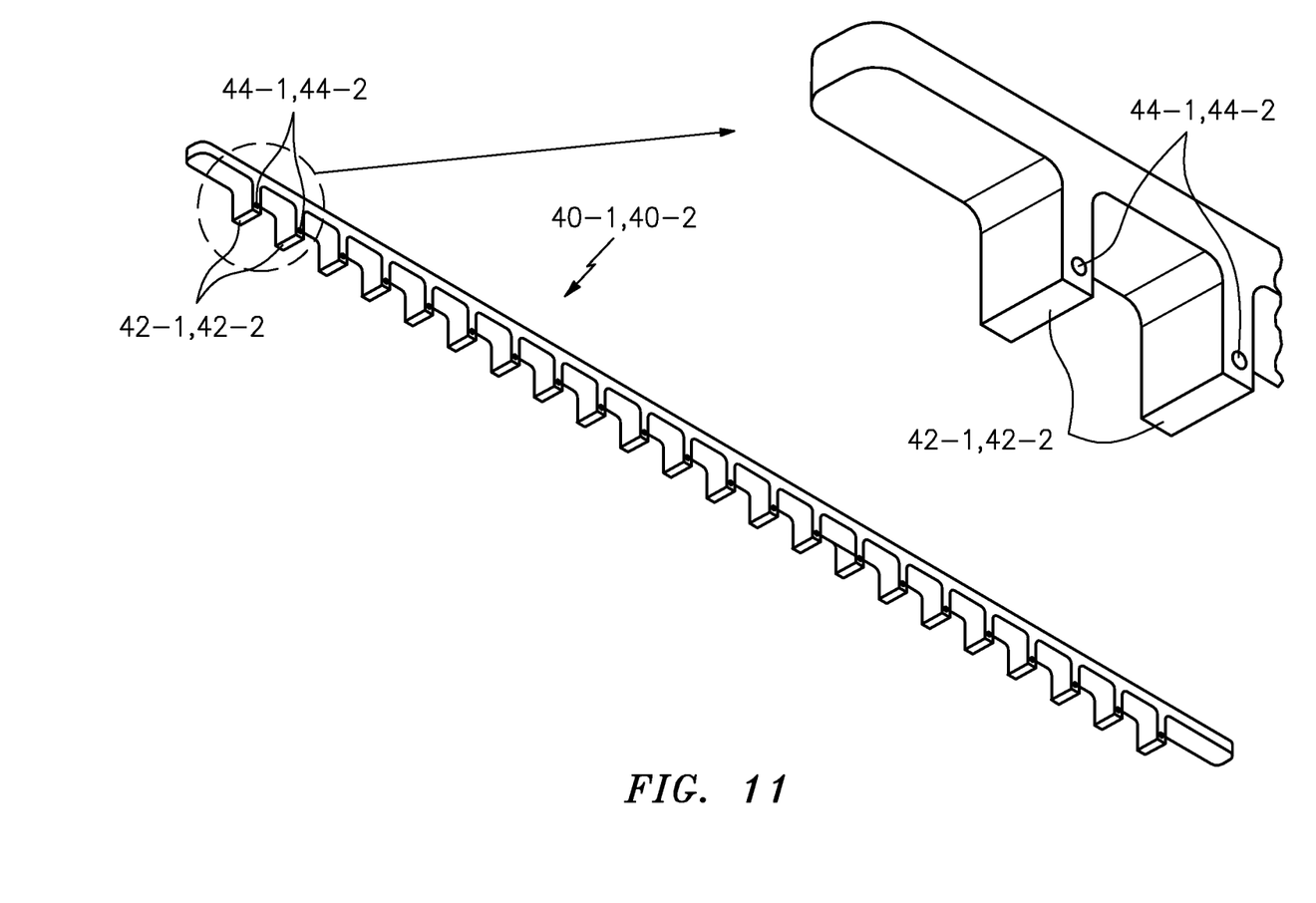
FIG. 11 is a perspective view of a cap which closes the trough of the cold plate assembly.

With reference to FIG. 10, each cap 40-1, 40-2 includes a multiple of cap teeth 42-1, 42-2 (FIG. 11) which are each received within the respective open area 36-1, 36-2 of the troughs 34-1, 34-2. Each of the cap teeth 42-1, 42-2 define a respective fluid path orifice 44-1, 44-2 which provide fluid passage control therethrough.

Figure 12:
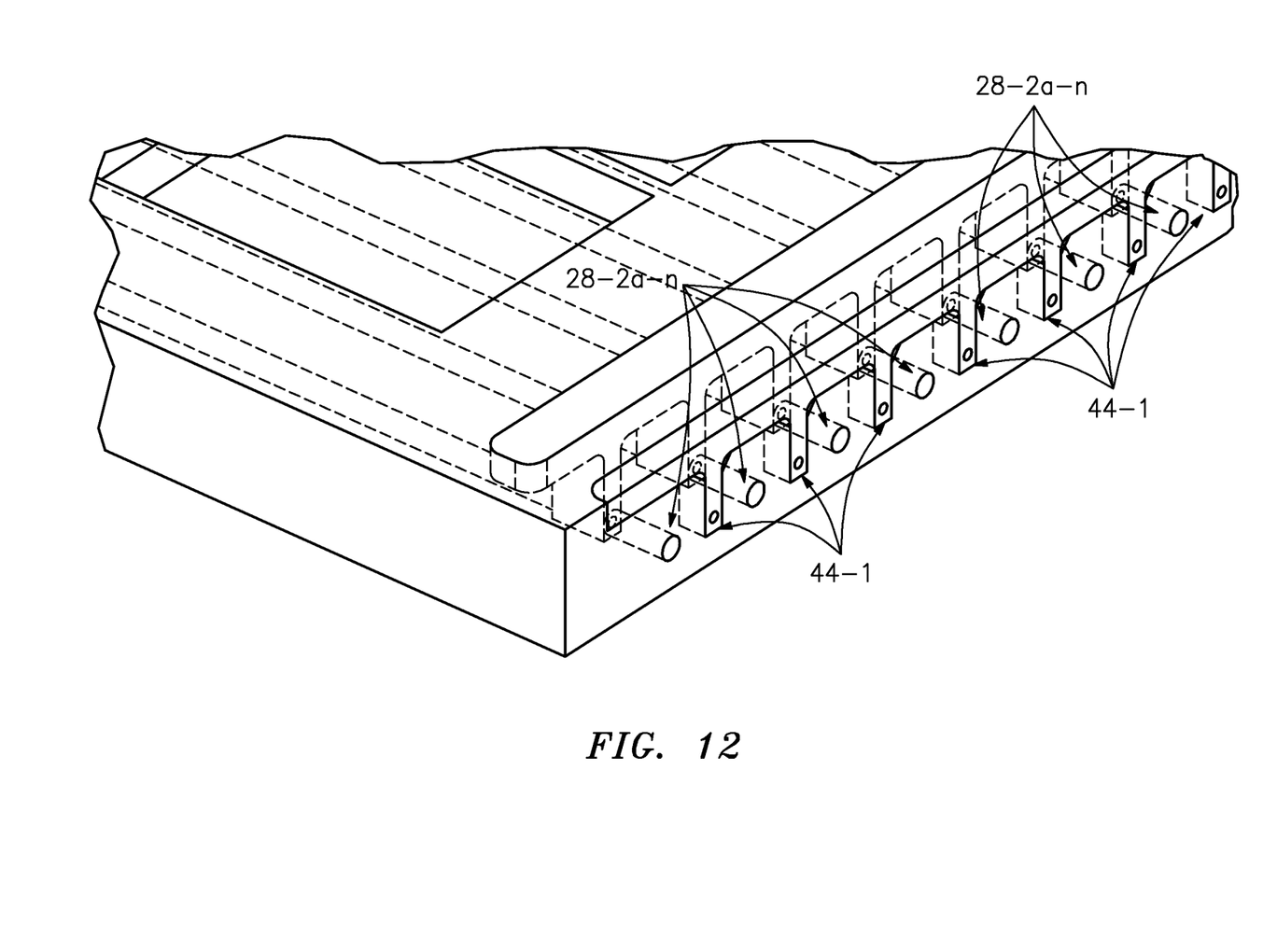
FIG. 12 is an expanded sectional view along line 12-12 in FIG. 4 to illustrate the cap which closes the trough and the location of the orifices within the individual gun drilled fluid passages.

Each of the fluid path orifices 44-1, 44-2 are sized to be generally smaller than the gun drilled passages P1, P2 of the respective individual fluid passages 28-1*a-n*, 28-2*a-n* to control fluid flow and distribution within the fluid paths 28-1, 28-2 (FIG. 12). That is, the fluid path orifices 44-1, 44-2 provide proper fluid distribution through each individual fluid passage 28-1*a-n*, 28-2*a-n* of the respective first fluid path 28-1 and second fluid path 28-2 without the heretofore required separate individual orifice insertions which are individually secured.

It should be understood that each fluid path orifice 44-1, 44-2 within the respective cap 40-1, 40-2 may be of a different size to control fluid flow distribution therethrough. That is, one end of each cap 44-1, 44-2 may provide a relatively small fluid path orifice 44-1, 44-2 while the opposite end of the cap 40-1, 40-2 may have a slightly larger fluid path orifice 44-1, 44-2 with a gradient of sizes therebetween. Although discreet fluid path orifices 44-1, 44-2 are illustrated in the disclosed non-limiting embodiment, it should be understood that fluid control may alternatively or additionally be provided through, for example, a gap between cap teeth and the trough teeth.

The cap and trough arrangement disclosed herein assures that any mismatch within the numerous parallel oriented individual fluid passages 28-1*a-n* and 28-2*a-n* which are each gun drilled from opposite sides of the monolithic plate 22 is eliminated and any actual drill wander is readily measureable. Integral incorporation of the fluid path orifices 44-1, 44-2 into the caps 40-1, 40-2 also eliminates individual orifices and assembly requirements such that overall parts count and cost is significantly reduced.

It should be understood that like reference numerals identify corresponding or similar elements throughout the several drawings. It should also be understood that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A cold plate assembly comprising:
a monolithic cold plate which defines a trough located to intersect a fluid path, wherein the trough is spaced from a manifold and forms an opening through a face of the monolithic cold plate and the opening extends the substantial length of the trough through the face.

2. The cold plate assembly as recited in claim 1, wherein said fluid path includes a multiple of parallel passages, each of said parallel passages defined by a first gun drilled passage which intersects said trough and a second gun drilled passage which opposes said first passage which intersects said trough.

3. The cold plate assembly as recited in claim 2, wherein said trough is of a generally toothed configuration with a multiple of open areas, each of said multiple of open areas corresponds with one of said multiple of parallel passages.

4. The cold plate assembly as recited in claim 3, further comprising a cap which is receivable within said trough, said cap defines a multiple of cap teeth, each of which fit within one of said respective multiple of open areas.

5. The cold plate assembly as recited in claim 4, wherein each of said multiple of cap teeth define an orifice which provide fluid communication between said first gun drilled passage and said second gun drilled passage.

6. The cold plate assembly as recited in claim 5, wherein each of said orifices is smaller than said respective first gun drilled passage and said second gun drilled passage.

7. The cold plate assembly as recited in claim 2, wherein said trough is of a generally toothed configuration with a multiple of trough teeth which separate said multiple of parallel passages.

8. The cold plate assembly as recited in claim 7, wherein said multiple of trough teeth intersect a second fluid path parallel to said fluid path.

9. The cold plate assembly as recited in claim 8, wherein said second fluid path includes a second multiple of parallel passages, each of said second multiple of parallel passages defined by a first gun drilled passage and a second gun drilled passage which intersect said trough, one of said opposed first gun drilled passage and said second gun drilled passage penetrate through a respective one of said multiple of trough teeth.

10. A cold plate assembly comprising:
a monolithic cold plate which defines a trough located to intersect a fluid path with a multiple of parallel passages, each of said multiple of parallel passages defined by an opposed first gun drilled passage and a second gun drilled passage which intersect said trough, said trough defines a generally toothed configuration with a multiple of open areas, each of said multiple of open areas corresponds with one of said multiple of parallel passages to separate said respective opposed first gun drilled passage and said second gun drilled passage; and
a cap which is receivable within said trough, said cap defines a multiple of cap teeth which fit within said respective multiple of open areas, each of said multiple of cap teeth defines an orifice which provides fluid communication between said respective opposed first gun drilled passage and said second gun drilled passage.

11. The cold plate assembly as recited in claim 10, wherein each of said orifices is smaller than said respective opposed first gun drilled passage and said second gun drilled passage.

12. The cold plate assembly as recited in claim 10, wherein each of said multiple of open areas are separated by a trough tooth that intersects a second fluid path.

13. The cold plate assembly as recited in claim 12, wherein said second fluid path includes a second multiple of parallel passages, each of said second multiple of parallel passages defined by an opposed first gun drilled passage and a second gun drilled passage which intersect said trough, one of said opposed first gun drilled passage and said second gun drilled passage penetrates through a respective one of said multiple of trough teeth.

14. The cold plate assembly as recited in claim 13, further comprising a second cap parallel to and offset from said cap, said second cap receivable within a second trough parallel to and offset from said trough, said second cap defines a second multiple of cap teeth, each of said second multiple of cap teeth adjacent to each of said multiple of trough teeth, each of said second multiple of cap teeth define an orifice which provides fluid communication between each of said opposed first gun drilled passage and said second gun drilled passage of said second fluid path.

15. The cold plate assembly as recited in claim 1, wherein the fluid path separates the manifold from the trough.

16. The cold plate assembly as recited in claim 1, wherein the trough is located in a midsection of the monolithic cold plate.

17. The cold plate assembly as recited in claim 1, wherein the monolithic cold plate includes a first fluid path and a second fluid path, the first fluid path located on a first side of the trough and the second fluid path located on a second side of the trough, the second side being opposite the first side.

18. The cold plate assembly as recited in claim 1, wherein the trough is of a toothed configuration and the teeth extend from a first side of the trough to a second side of the trough.

19. The cold plate assembly as recited in claim 1, wherein the manifold is an intake manifold.

20. The cold plate assembly as recited in claim 1, further comprising a cap configured to be received within said trough.

21. The cold plate assembly of claim 2, wherein the first gun drilled passage is only partially aligned with the second gun drilled passage.

22. A cold plate assembly comprising:
a monolithic cold plate which defines a trough located to intersect a fluid path, wherein the trough is spaced from a manifold and forms an opening through a face of the monolithic cold plate wherein a plurality of teeth extend into the trough.

23. The cold plate assembly of claim 1, wherein a plurality of teeth extend into the trough.

* * * * *